AMPLITUDE-STABILIZED SWEEP GENERATOR

Filed June 21, 1954 2 Sheets-Sheet 1

INVENTOR.
CHARLES H. CHANDLER
BY Charles H. Brown
ATTORNEY

Feb. 9, 1960 C. H. CHANDLER 2,924,707

AMPLITUDE-STABILIZED SWEEP GENERATOR

Filed June 21, 1954 2 Sheets-Sheet 2

INVENTOR.
CHARLES H. CHANDLER
BY
Charles H. Brown
ATTORNEY

United States Patent Office 2,924,707

Patented Feb. 9, 1960

2,924,707

AMPLITUDE-STABILIZED SWEEP GENERATOR

Charles H. Chandler, Princeton, N.J., assignor to Radio Corporation of America, a corporation of Delaware Application June 21, 1954, Serial No. 438,193

6 Claims. (Cl. 250—27)

The invention relates to amplitude-stabilized sweep generators capable of producing saw-tooth waves. The invention particularly relates to such amplitude-stabilized sweep generators which produce saw-tooth waves having substantially constant amplitudes in response to triggering pulses of a wide range of frequencies applied to such generators.

In many applications it is desirable to have a sweep voltage or saw-tooth wave which can be reliably synchronized with some external wave in the circuits under study; and in particular, with the exact frequency of that external wave and not some multiple or sub-multiple thereof. A triggered or slave sweep generator is a method of obtaining such synchronism. In studying the performance of counting circuits, frequency dividing circuits, or frequency multiplying circuits using a triggered sweep voltage or saw-tooth wave, constant amplitude of the saw-tooth wave over a wide range of frequencies is advantageous and desirable.

It is an object of the invention to provide a novel sweep generator for producing a saw-tooth wave of substantially constant amplitude in response to a triggering signal having a wide range of frequencies.

Briefly, the invention utilizes an energy storage device or capacitor that is charged and discharged in response to a positive triggering signal or pulse to produce the saw-tooth wave. An electron discharge device connected substantially in parallel with the capacitor serves to discharge the capacitor during the triggering pulse. The voltage for charging the capacitor is varied as a function of the frequency or repetition rate of the triggering pulse so as to maintain a constant amplitude of the saw-tooth wave. The varying charging voltage may be obtained in two ways. In one embodiment of the invention, a comparator circuit compares the amplitude of the sweep voltage with a predetermined reference voltage and develops a charging voltage controlled by the difference. In the other embodiment of the invention, a rectifier and filter circuit develops a charging voltage that is proportional to the frequency of the triggering signal.

The invention is explained in detail in the following description with reference to the accompanying drawing in which the same reference numerals refer to corresponding parts in all figures.

Figure 1:
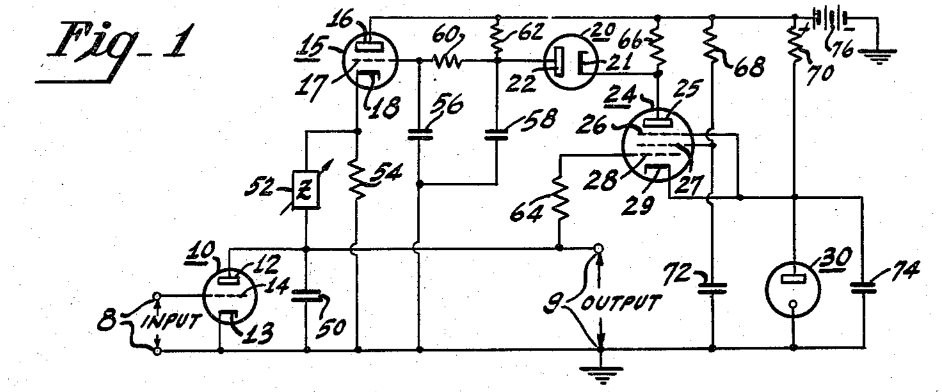
Fig. 1 shows a circuit diagram of a sweep generator in accordance with one embodiment of the invention.

In Fig. 1, the input terminals 8 of the generator are connected to the control grid 14 of an evacuated electron discharge device 10 and to ground. The cathode 13 of the device 10 is also connected to ground. The anode 12 is connected to one terminal of an energy storage device or capacitor 50, which has its other terminal connected to ground. When a positive triggering signal or pulse is applied to the input terminals 8 and to the control grid 14, the electron discharge device 10 conducts, thus discharging the capacitor 50. Between such pulses, the electron discharge device 10 is held cut off, as for example by an external bias, so that the capacitor 50 may be charged. The voltage produced by this action is thus a saw-tooth wave having a period rigidly controlled by the frequency or repetition rate of the triggering pulses. This voltage is applied to the output terminals 9 of the generator as is indicated in Fig. 1.

The charging voltage for the capacitor 50 is developed across a resistor 54, and this voltage is determined by the current flow through an evacuated electron discharge device 15 which is normally conducting and derives its current from a source of D.-C. potential 76. The anode 16 of the electron discharge device 15 is connected to the positive terminal of the source of D.-C. potential 76, and the cathode 18 is connected to one end of the resistor 54, the other end of which is connected to ground. A variable impedance device 52 is connected between the cathode 18 and the capacitor 50. This impedance device 52 may take various forms, such as a resistor, a resistor and inductor, or a pentode tube. Its purpose is to control the rate at which the capacitor 50 is charged so that the charging rate may be varied.

The charging voltage across the resistor 54 is varied as a function of the repetition rate of the triggering pulses by a comparator circuit. The comparator circuit includes an evacuated electron discharge device 24, which is preferably a high-gain vacuum tube such as a pentode, a diode 20, and a voltage regulator or reference tube 30. The control grid 28 of the electron discharge device 24 is connected to the capacitor 50 through a resistor 64. The anode 25 and the screen grid 27 are connected to the positive terminal of the source of D.-C. potential 76 by resistors 66 and 68 respectively. The screen grid 27 is by-passed to ground by a capacitor 72. The cathode 29 and the suppressor grid 26 are connected together. A resistor 70 connects the positive terminal of the source of D.-C. potential 76 to the voltage reference tube 30 for the purpose of maintaining minimum rated current through the tube 30. The voltage reference tube 30, which is preferably by-passed by a capacitor 74, connects the cathode 29 to ground. The reference tube 30 maintains a predetermined positive or reference voltage on the cathode 29. This reference voltage holds the electron discharge device 24 cut off until the voltage on the control grid 28 becomes sufficiently positive to overcome the reference voltage and allow the electron discharge device 24 to conduct.

The cathode 21 of the diode 20 is connected to the anode 25. The anode 22 of the diode 20 is connected to the positive terminal of the source of D.-C. potential 76 through a resistor 62. The anode 22 is also connected to the control grid 17 of the electron discharge device 15 through a resistor 60, which is by-passed to ground by the capacitors 56 and 58. The resistor 60 and capacitors 56 and 58 serve as a smoothing or filter network to maintain a substantially D.-C. voltage on the control grid 17 of the electron discharge device 15. The time constant of the resistor 62 and the capacitor 58 is preferably large compared to the period of the triggering pulses.

The storage capacitor 50 is charged between the pulses of the triggering signal. If the capacitor 50 is allowed to charge to a sufficiently high voltage as a result of a low repetition rate of the triggering pulses, this voltage will become high enough to overcome the reference voltage and cause the electron discharge device 24 to conduct current. This flow of current will lower the voltage on the anode 25, and this causes the diode 20 to conduct more current, thus lowering the voltage on the anode 22 of the diode 20. The lowered voltage on the anode 22 of the diode 20 is filtered and connected to the control grid 17 of the electron discharge device 15 by the resistor 60 and the capacitors 56 and 58. This lowered voltage will appear on the control grid 17 of the electron discharge device 15, thus reducing the flow of current through the electron discharge device 15 and the resistor 54. In this way the charging voltage for the capacitor 50 is reduced so that the amplitude of the saw-tooth wave remains constant despite a lower repetition rate of triggering pulses. If the repetition rate of the triggering pulses is increased, the capacitor 50 is not allowed to charge to as high a voltage, thus reducing the voltage on the control grid 28. This reduction of voltage causes the electron discharge device 24 to conduct less current, thus allowing the voltage on the anode 25 to rise. As the voltage on the anode 25 rises, the diode 20 conducts less current and this results in the voltage on the anode 22 of the diode 20 also rising. The rise in voltage on the anode 22 of the diode is filtered and connected to the control grid 17 of the electron discharge device 15 by the resistor 60 and the capacitors 56 and 58. With a rise in voltage on the control grid 17, the electron discharge device 15 conducts more current. This increase in current flows through the resistor 54, thus increasing the charging voltage on the capacitor 50. In this way, the amplitude of the saw-tooth wave remains constant despite a higher repetition rate of triggering pulses.

It should be noted that the comparator circuit varies the charging voltage on the capacitor 50 as long as the amplitude of the saw-tooth wave produced across the capacitor 50 and appearing at the output terminal 9 at least equals the value of grid voltage required for the electron discharge device 24 to conduct. If the repetition rate of the triggering pulses becomes too high or too low for the comparator circuit to compensate for, the impedance device 52 may be decreased or increased so that the regulating action of the comparator circuit may again become effective. For a given setting of the impedance device 52, the generator should produce saw-tooth waves of constant amplitude for repetition rates that vary over a range of the order of ten to one.

Figure 2:
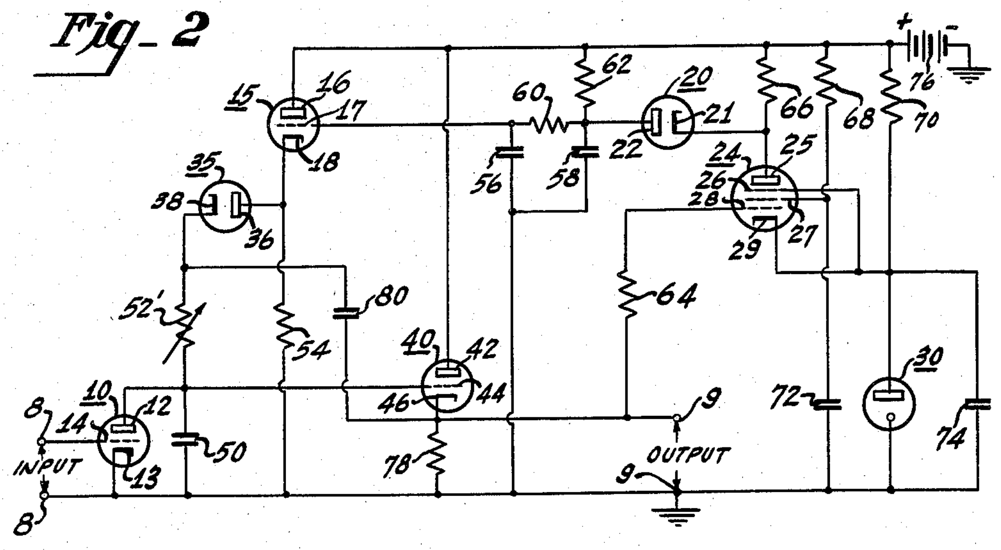
Fig. 2 shows a circuit diagram of a sweep generator in accordance with the embodiment shown in Fig. 1 having, in addition, a linearizing circuit.

A slightly different embodiment of the sweep generator shown in Fig. 1 is shown in Fig. 2. A linearizing or bootstrap circuit has been added to give a more linear saw-tooth wave. The linearizing circuit includes a diode 35 and an evacuated electron discharge device 40. The variable impedance device 52′ is shown as a resistor, as it gives excellent linearity in this application. The resistor 52′ is connected between the storage capacitor 50 and the cathode 38 of the diode 35. The cathode 38 is connected to the cathode 46 of the electron discharge device 40 through a capacitor 80. The cathode 46 is connected to the ground by a resistor 78 so that the electron discharge device 40 serves as a cathode follower. The control grid 44 is connected to the capacitor 50, and the anode 42 is connected to the positive terminal of the source of D.-C. potential 76.

Between triggering pulses, the capacitor 50 is allowed to charge, the charging voltage for the capacitor 50 being developed across the resistor 54 as in Fig. 1. As the voltage across the capacitor 50 rises, the voltage on the control grid 44 also rises. The electron discharge device 40 then conducts more current, thus causing the voltage across the resistor 78 to rise. This rising voltage is applied to the cathode 38 of the diode 35 through the capacitor 80. As the capacitor 50 continues to charge, the cathode 38 will become more positive than the anode 36 of the diode 35, so that the diode 35 is cut off. After the diode 35 is cut off, the charging voltage is determined by the voltage across the resistor 78. As the voltage across the capacitor 50 continues to rise, the voltage across the resistor 78 continues to rise at substantially the same rate. Thus the capacitor 50 is, in effect, being charged from a voltage which is rising at a rate substantially the same as the rate at which the voltage across the capacitor 50 is rising. Thus the capacitor 50 is charged at a substantially constant rate.

It should be noted that at the outset, the rate at which the voltage across the capacitor 50 commences to rise is determined by the voltage across the resistor 54 or on the cathode 18 of the electron discharge device 15. Since the voltage on the cathode 18 is controlled by the comparator circuit, constant amplitude of the output saw-tooth wave is maintained.

Figure 3:
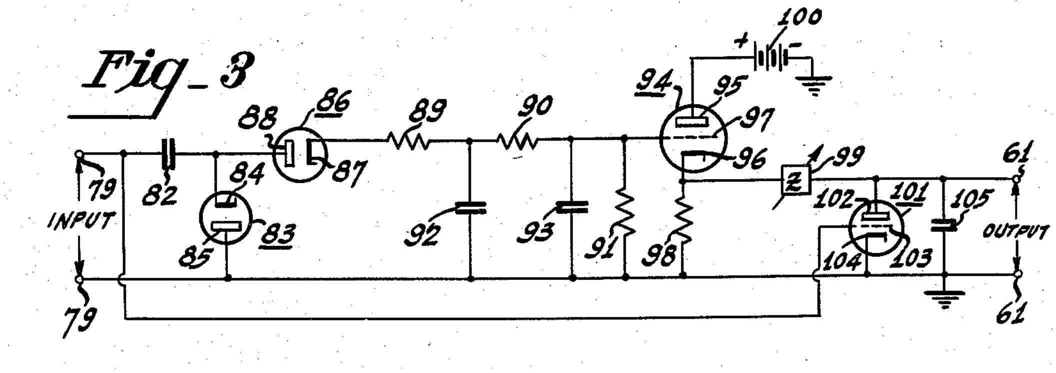
Fig. 3 shows a circuit diagram of a sweep generator in accordance with another embodiment of the invention.

A different embodiment of a sweep generator is shown in Fig. 3. The input terminals 79 are connected to the control grid 103 of an evacuated electron discharge device 101 and to ground. The cathode 104 is also connected to ground. The anode 102 is connected to one terminal of an energy storage device or capacitor 105, which has its other terminal connected to ground. When a positive triggering signal or pulse is applied to the input terminals 79 and to the control grid 103, the electron discharge device 101 conducts, thus discharging the capacitor 105. Between the pulses, the electron discharge device 101 is held cut off, as for example by an external bias, so that the storage capacitor 105 may be charged. The voltage produced by the capacitor 105 is thus a saw-tooth wave having a period controlled by the frequency or repetition rate of the triggering pulses. This voltage is available for utilization at the output terminals 81.

The charging voltage for the capacitor 105 is developed across a resistor 98, and this voltage is determined by the voltage on the control grid 97 of an evacuated electron discharge device 94 that is connected as a cathode follower. The voltage on the control grid 97 is derived from a rectifier and filter circuit to which the triggering pulses are applied. The anode 95 is connected to the positive terminal of a source of D.-C. potential 100, and the cathode 96 is connected to one end of the resistor 98, the other end of which is connected to ground. A variable impedance device 99 is connected between the cathode 96 and the capacitor 105. This impedance device may be of almost any suitable form capable of passing direct current, and its purpose is to control the rate at which the capacitor 105 is charged.

The charging voltage across the resistor 98 is varied as a function of the repetition rate of the triggering pulses by the voltage derived from the rectifier and filter circuit and applied to the control grid 97. This circuit rectifies the triggering pulses and averages them to produce a voltage that is proportional to and that varies directly as the repetition rate of the triggering pulses. To accomplish this, it is necessary that the triggering pulses be of substantially uniform amplitude and duration. If the triggering pulses are not uniform in amplitude and duration, they may be made so by some device such as a monostable or one-shot multivibrator. Such a multivibrator is known in the art, and would switch to the unstable condition on receipt of a triggering pulse, and switch back to the stable condition at the end of the period.

The input terminals 79 of the generator are also connected to one terminal of a capacitor 82 and to ground. The other terminal of the capacitor 82 is connected to the cathode 84 of a diode 83 and to the anode 88 of a diode 86. The anode 85 of the diode 83 is connected to ground. The cathode 87 of diode 86 is connected to one terminal of a resistor 89 and the other terminal of the resistor 89 is connected to ground by a capacitor 92. The other terminal of the resistor 89 is also connected to the control grid 97 through a resistor 90. A capacitor 93 and a resistor 91 are connected between the control grid 97 and ground.

The triggering pulses of uniform amplitude and width are rectified and filtered to produce a voltage that is proportional to and varies directly as the repetition rate of the triggering pulses. The pulses are rectified by the two diodes 83 and 86, the diode 83 clamping the negative portions of the pulses to ground, and the diode 86 passing the positive portions of the pulses to the filter circuit. This circuit comprises the two resistors 89 and 90, and the two capacitors 92 and 93 which average or smooth the rectified pulses to produce a voltage that is proportional to and varies directly as the repetition rate of the triggering pulses. This voltage is applied to the control grid 97 to control the current flow through the electron discharge device 94 and the resistor 98. As the current flow is varied, the charging voltage across the resistor 98 is also varied. Between triggering pulses, the capacitor 50 is allowed to charge. If the repetition rate of the triggering pulses is high, the charging voltage is also high. If the repetition rate of the triggering pulses is low, the charging voltage is also low. In this way, the amplitude of the saw-tooth wave remains constant for varying repetition rates of the triggering pulses.

Figure 4:
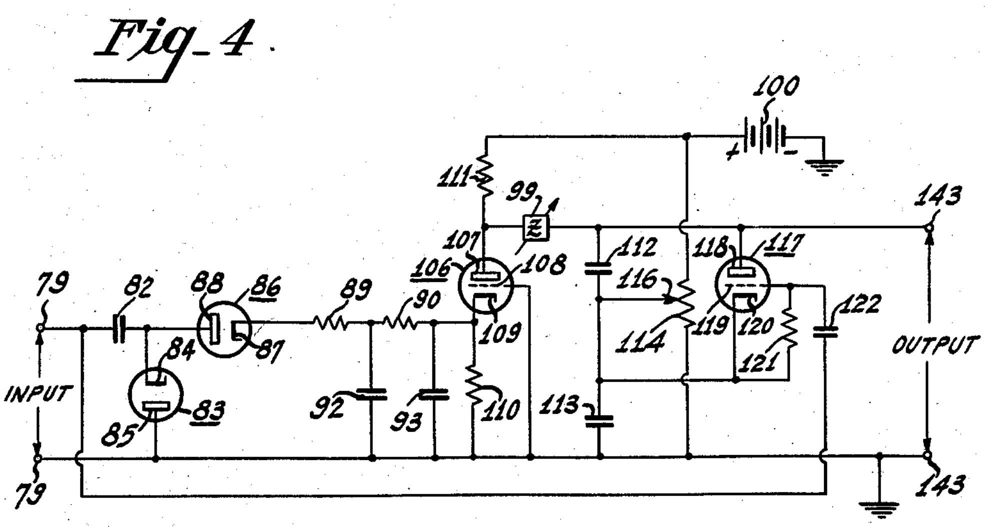
Figs. 4 and 5 show circuit diagrams of a sweep generator in accordance with the embodiment shown in Fig. 3, but having different means of applying the charging voltage to the capacitor.
Figure 5:
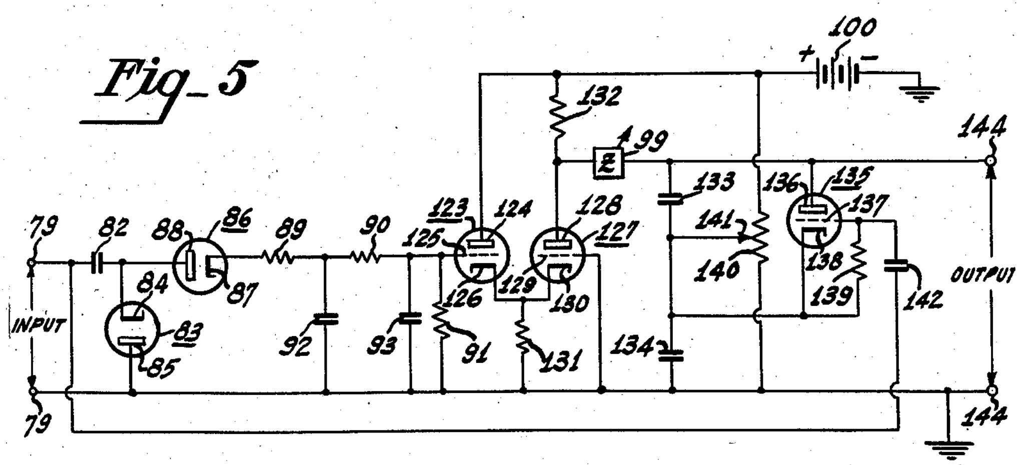

Two other circuit diagrams for applying the voltage derived from the rectifier and filter circuit are shown in Figs. 4 and 5. In Fig. 4 the voltage derived from the rectifier and filter circuit is applied to the cathode 109 of an evacuated electron discharge device 106 that is connected as a grounded grid amplifier. The cathode 109 is connected to ground through a resistor 110. The control grid 108 is connected directly to ground, and the anode 107 is connected through a resistor 111 to the positive terminal of the source of D.-C. potential 100. The variable impedance device 99 is connected between the anode 107 and the anode 118 of an evacuated electron discharge device 117. While shown separately, the electron discharge devices 106 and 117 may be contained in a single envelope.

The control grid 119 of the normally cut off electron discharge device 117 is connected to one input terminal by a capacitor 122 and to the cathode 120 by a resistor 121. The cathode 120 is connected to ground through a capacitor 113. The cathode 120 is also connected to the anode 118 by the output or storage capacitor 112. A resistor 114 having a variable contact 116 is connected between the positive terminal of the source of D.-C. potential 100 and ground. The variable contact 116 is connected to the cathode 120. It is adjusted so that no voltage appears across the capacitor 112 in the absence of triggering pulses applied to the input terminals 79. As shown, the output is derived between terminals 143 connected to the anode 118 and ground.

As the voltage derived from the rectifier and filter circuit and applied to the cathode 109 varies, the voltage on the anode 107 also varies in the same direction and with greater amplitude due to the amplifying action of the electron discharge device 106. This voltage determines the rate at which the capacitor 112 charges, and thereby also the amplitude reached by the saw-tooth wave between triggering input pulses. The electron discharge device 117 discharges the capacitor 112 when a positive triggering pulse is applied to the input terminals 79 and to the control grid 119 through the capacitor 122, which provides A.-C. coupling. This embodiment has the advantage, over that of Fig. 3, that a greater amplitude of saw-tooth output is obtained with a given frequency of input pulse signal.

In Fig. 5, the voltage derived from the rectifier and filter circuit is applied to the control grid 125 of an evacuated electron discharge device 123 that is connected as a cathode follower. The anode 124 is connected to the positive terminal of the source of D.-C. potential 100, and the cathode 126 is connected to ground through a resistor 131.

An evacuated electron discharge device 127 is connected as a grounded grid amplifier. The cathode 130 is connected to the cathode 126, and the anode 128 is connected to the positive terminal of the source of D.-C.

potential 100 through a resistor 132. The control grid 129 is connected to ground. While shown separately, the electron discharge devices 123 and 127 may be contained in a single envelope. The variable impedance device 99 is connected between the anode 128 and the anode 136 of an electron discharge device 135. The cathode 138 is connected to the anode 136 through the output capacitor 133, and to ground through a capacitor 134. A resistor 139 is connected between the cathode 138 and the control grid 137. The control grid 137 is connected to one input terminal through a capacitor 142. A resistor 140 having a varibale contact 141 is connected between the positive terminal of the source of D.-C. potential 100 and ground. The variable contact 141 is connected to the cathode 138, and is adjusted so that no voltage appears across the capacitor 133 in the absence of triggering pulses applied to the input terminals 79. As shown, the output is derived between terminals 144 connected to the anode 136 and ground.

As the voltage derived from the rectifier and filter circuit and applied to the control grid 125 varies, the voltage on the cathodes 126 and 130 also varies. As the voltage on the cathode 130 varies, the voltage on the anode 128 also varies. This voltage determines the rate at which the capacitor 133 charges and thereby also the amplitude reached by the saw-tooth wave between input triggering pulses. The electron discharge device 135 discharges the capacitor 133 when a triggering pulse is applied to the input terminals 79 and to the control grid 137 through the capacitor 142, which provides A.-C. coupling. This embodiment has the advantage, over that of Fig. 4, that the rectifier and filter circuit is not loaded by the cathode follower tube 123 as heavily as it was loaded by the grounded-grid amplifier tube 106 of Fig. 4. This allows the voltage derived from the rectifier and filter circuit to be more efficiently used.

The invention claimed is:

1. A generator for producing a saw-tooth wave of substantially constant amplitude in response to a pulse signal of varying repetition rate applied to input terminals of said generator, comprising an output capacitor having one terminal connected to a ground, a first electron discharge device having at least an anode, a cathode, and a control grid for admitting said pulse signal and for discharging said capacitor, said cathode being connected to said ground, said anode being connected to the other terminal of said capacitor, and said control grid being connected to one of said input terminals, a linearizing circuit connected to said anode of said first electron discharge device for producing a linear charging voltage at its output terminal proportional to the amplitude of the voltage on said output capacitor, a comparator circuit connected to said output terminal of said linearizing circuit for producing a voltage at its output terminal proportional to said output voltage produced at said output terminal of said linearizing circuit, a second electron discharge device having at least an anode, a cathode, and a control grid, said control grid of said second electron discharge device being connected to said output terminal of said comparator circuit, means for applying a source of direct current potential to said anode of said second electron discharge device, a resistor for producing a charging voltage from said source of direct current potential connected between said cathode of said second electron discharge device and said ground, a diode having its anode connected to said cathode of said second electron discharge device, a capacitor connected between the cathode of said diode and said output terminal of said linearizing circuit, and a variable resistor for controlling the rate of charging of said output capacitor connected between said cathode of said diode and said anode of said first electron discharge device.

2. A generator for producing a saw-tooth wave of substantially constant amplitude in response to a signal of varying repetition rate applied to input terminals of said generator, comprising a capacitor, a first electron discharge device having an anode, a cathode; and a control grid for discharging said capacitor, said anode and said cathode being connected in parallel with said capacitor and said control grid being connected to one of said input terminals, a second electron discharge device having an anode, a cathode, and a control grid for charging said capacitor, a resistor connected in series with said cathode of said second electron discharge device for producing a charging voltage from a source of direct current potential applied to said anode of said second electron discharge device, and a comparator circuit connected between said capacitor and said control grid of said second electron discharge device for varying the current flow through said second electron discharge device and the resultant charging voltage developed thereby across said resistor as a function of the amplitude of the voltage on said capacitor, said comparator circuit comprising a third electron discharge device having an anode, a cathode, and a control grid, means connected to said cathode of said third electron discharge device for applying a reference voltage thereto, means connecting said control grid of said third electron discharge device to said anode of said first electron discharge device, and means connecting said anode of said third electron discharge device to said control grid of said second electron discharge device.

3. A generator for producing a saw-tooth wave of substantially constant amplitude in response to a signal of varying repetition rate applied to input terminals of said generator, comprising a capacitor having one terminal connected to a ground, a first electron discharge device having an anode, a cathode, and a control grid for discharging said capacitor, said cathode being connected to said ground, said anode being connected to the other terminal of said capacitor, and said control grid being connected to one of said input terminals, a direct current terminal for applying a source of direct current potential to said generator, a second electron discharge device having an anode, a cathode, and a control grid, said anode of said second electron discharge device being connected to said direct current terminal, a resistor for producing a charging voltage from said source of direct current potential connected between said cathode of said second electron discharge device and ground, a comparator circuit connected to said anode of said first electron discharge device for producing a voltage at its output terminal proportional to the amplitude of the voltage on said capacitor, said comparator circuit comprising a third electron discharge device having an anode, a cathode, and a control grid, means connected to said cathode of said third electron discharge device for applying a reference voltage thereto, means connecting said control grid of said third electron discharge device to said anode of said first electron discharge device, means connecting said anode of said third electron discharge device to said direct current terminal, a diode having its cathode connected to said anode of said third electron discharge device and its anode connected to said control grid of said second electron discharge device, and a variable impedance device connected between said cathode of said second electron discharge device and said anode of said first electron discharge device for controlling the rate of charging said capacitor.

4. A generator for producing a saw-tooth wave of substantially constant amplitude in response to a signal of varying repetition rate applied to input terminals of said generator, comprising a capacitor having one terminal connected to a ground, a first electron discharge device having an anode, a cathode, and a control grid for discharging said capacitor, said cathode being connected to said ground, said anode being connected to the other terminal of said capacitor, and said control grid being connected to one of said input terminals, a direct current terminal for applying a source of direct current potential to said generator, a second electron discharge device having an anode, a cathode, and a control grid, said anode of said second electron discharge device being connected to said direct current terminal, a resistor for producing a charging voltage from said source of direct current potential connected between said cathode of said second electron discharge device and said ground, a comparator circuit connected to said anode of said first electron discharge device for producing a voltage at its output terminal proportional to the amplitude of the voltage on said capacitor, said comparator circuit comprising a third electron discharge device having an anode, a cathode, and a control grid, a voltage regulator tube connected between said cathode of said third electron discharge device and ground, means connecting said cathode of said third electron discharge device to said direct current terminal, means connecting said control grid of said third electron discharge device to said anode of said first electron discharge device, means connecting said anode of said third electron discharge device to said direct current terminal, means connecting said anode of said third electron discharge device to said control grid of said second electron discharge device, and a variable impedance device connected between said cathode of said second electron discharge device and said anode of said first electron discharge device for controlling the rate of charging said capacitor.

5. A generator for producing a saw-tooth wave of substantially constant amplitude in response to a signal of varying repetition rate applied to input terminals of said generator, comprising a capacitor having one terminal connected to a ground, a first electron discharge device having an anode, a cathode, and a control grid for discharging said capacitor, said cathode being connected to said ground, said anode being connected to the other terminal of said capacitor, and said control grid being connected to one of said input terminals, a direct current terminal for applying a source of direct current potential to said generator, a second electron discharge device having an anode, a cathode, and a control grid, said anode of said second electron discharge device being connected to said direct current terminal, a resistor for producing a charging voltage from said source of direct current potential connected between said cathode of said second electron discharge device and ground, a comparator circuit connected to said anode of said first electron discharge device for producing a voltage at its output terminal proportional to the amplitude of the voltage on said capacitor, said comparator circuit comprising a third electron discharge device having an anode, a cathode, and a control grid, a voltage regulator tube connected between said cathode of said third electron discharge device and said ground, a resistor connected between said cathode of said third electron discharge device and said direct current terminal, a resistor connected between said control grid of said third electron discharge device and said anode of said first electron discharge device, means connecting said anode of said third electron discharge device to said direct current terminal, a diode having its cathode connected to said anode of said third electron discharge device and its anode connected to said control grid of said second electron discharge device, and a variable impedance device connected between said cathode of said second electron discharge device and said anode of said first electron discharge device.

6. A generator for producing a saw-tooth wave of substantially constant amplitude in response to a signal of varying repetition rate applied to input terminals of said generator, comprising an output capacitor having one terminal connected to a ground, a first electron discharge device having an anode, a cathode, and a control grid responsive to said signal for discharging said capacitor, said cathode being connected to ground, said anode being connected to the other terminal of said capacitor, and said control grid being connected to one of said input terminals, a direct current terminal for applying a source of direct current potential, a second electron discharge device having an anode, a cathode, and a control grid, said anode of said second electron discharge device being connected to said direct current terminal, a resistor for producing a charging voltage from said source of direct current potential connected between said cathode of said second electron discharge device and ground, a linearizing circuit connected to said anode of said first electron discharge device for producing a linear charging voltage at its output terminal proportional to the amplitude of the voltage on said capacitor, a comparator circuit connected to said output terminal of said linearizing circuit for producing a voltage proportional to said voltage produced by said linearizing circuit, said comparator circuit comprising a third electron discharge device having an anode, a cathode, and a control grid, a voltage regulator tube connected between said cathode of said third electron discharge device and ground, a resistor connected between said cathode of said third electron discharge device and said direct current terminal, means connecting said control grid of said third electron discharge device to said output terminal of said linearizing circuit, means connecting said anode of said third electron discharge device to said direct current terminal, a first diode having its cathode connected to said anode of said third electron discharge device and its anode connected to said control grid of said second electron discharge device, a second diode having its anode connected to said cathode of said second electron discharge device, a capacitor connected between the cathode of said second diode and said output terminal of said linearizing circuit, and a variable resistor connected between said cathode of said second diode and said anode of said first electron discharge device for controlling the rate of charging of said output capacitor.

References Cited in the file of this patent

UNITED STATES PATENTS

| | | |
|---|---|---|
| 2,003,992 | Cockrell | June 4, 1935 |
| 2,266,516 | Russell | Dec. 16, 1941 |
| 2,413,063 | Miller | Dec. 24, 1946 |
| 2,448,069 | Ames et al. | Aug. 31, 1948 |
| 2,492,018 | Sunstein | Dec. 20, 1949 |
| 2,569,164 | Greenwood et al. | Sept. 25, 1951 |
| 2,581,199 | Moe | Jan. 1, 1952 |
| 2,627,031 | Moore | Jan. 27, 1953 |
| 2,726,331 | Robinson | Dec. 6, 1955 |